(12) United States Patent
Gabriel et al.

(10) Patent No.: US 6,316,834 B1
(45) Date of Patent: Nov. 13, 2001

(54) TUNGSTEN PLUGS FOR INTEGRATED CIRCUITS AND METHOD FOR MAKING SAME

(75) Inventors: Calvin T. Gabriel, Cupertino; Dipankar Pramanik, Saratoga; Xi-Wei Lin, Fremont, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/392,343

(22) Filed: Sep. 8, 1999

Related U.S. Application Data

(63) Continuation of application No. 09/097,318, filed on Jun. 12, 1998, now Pat. No. 5,990,561.

(51) Int. Cl.⁷ .......................... H01L 23/48; H01L 23/52; H01L 29/40
(52) U.S. Cl. .......................... 257/773; 257/736; 257/748; 257/764; 257/773; 438/644; 438/654
(58) Field of Search .................. 438/644, 611, 438/612–617, 648, 650, 654, 656, 685; 204/192.1; 257/736, 748, 753, 763, 764, 770, 773

(56) References Cited

U.S. PATENT DOCUMENTS

| | | | |
|---|---|---|---|
| 5,084,415 | * 1/1992 | Manocha et al. | 438/654 |
| 5,278,449 | 1/1994 | Miyakawa | 257/751 |
| 5,407,861 | 4/1995 | Marangon et al. | 438/628 |
| 5,600,182 | 2/1997 | Schinella et al. | 257/763 |
| 5,677,238 | * 10/1997 | Gn et al. | 438/653 |
| 5,804,502 | * 9/1998 | Gabriel et al. | 438/628 |

FOREIGN PATENT DOCUMENTS

08172127-A * 7/1996 (JP).
05160124-A * 6/1998 (JP).

OTHER PUBLICATIONS

Roede, Henk et al., "The Effect of Post W–Etchback Cleaning Treatments and Implementation of Refractory Metal Buffer Layers on the Electromigration Performance of TiN/AlCu/TiN/Ti Metallization Systems," Apr. 1995, pp. 1–6.

* cited by examiner

Primary Examiner—Eddie Lee
Assistant Examiner—Chris C. Chu
(74) Attorney, Agent, or Firm—Oppenheimer Wolff & Donnelly, LLP

(57) ABSTRACT

A method for producing a glue layer for an integrated circuit which uses tungsten plugs in accordance with the present invention includes: (A) providing a substrate which has a surface, a center, an edge, and a direction normal to the surface; and (B) sputter depositing a glue layer over the surface of the substrate such that an edge thickness of the glue layer measured in the direction normal to the surface at the edge of the substrate is at least 105% of a center thickness of the glue layer measured in the direction normal to the surface at the center of the substrate. In some embodiments, the edge thickness of said glue layer measured in the direction normal to the surface at the edge of the substrate is in the range of approximately 105% to 150% of the center thickness of the glue layer measured in the direction normal to the surface at the center of the substrate, as for example in the range of approximately 110% to 120% of the center thickness of the glue layer measured in the direction normal to the surface at the center of the substrate.

5 Claims, 6 Drawing Sheets

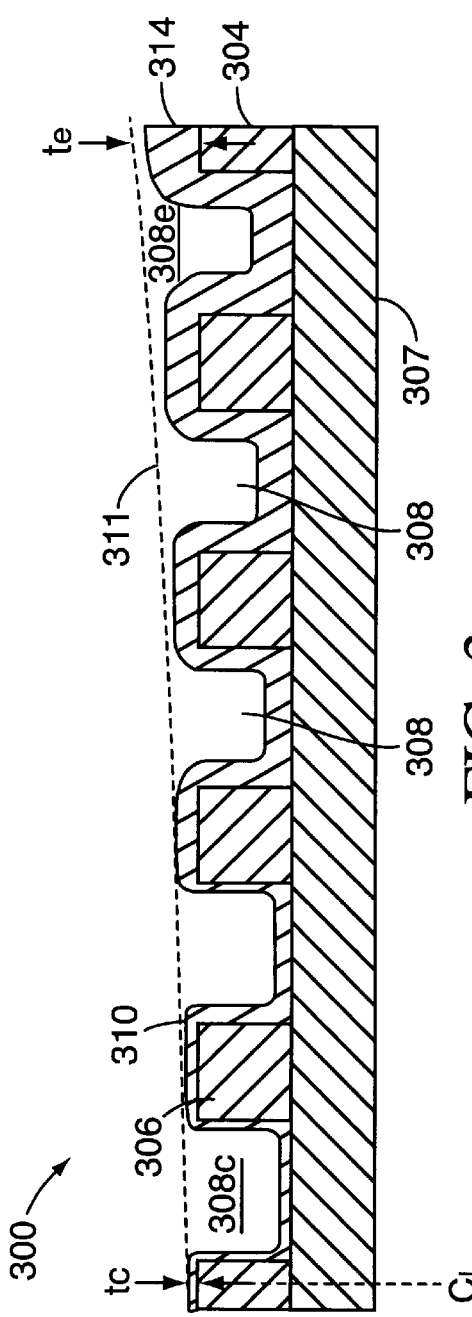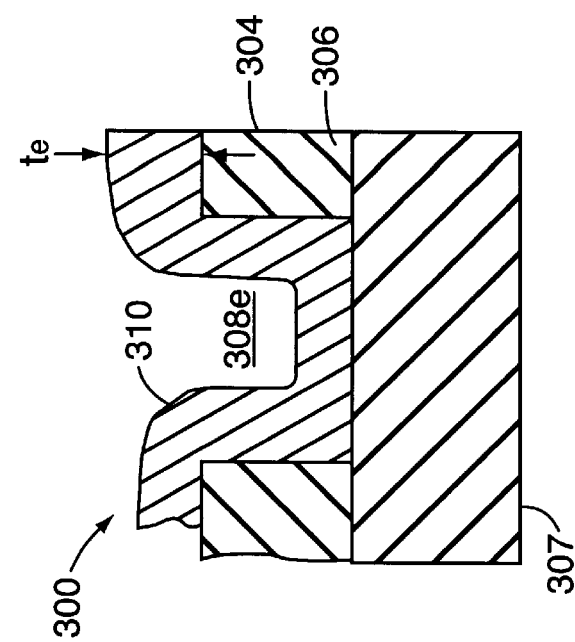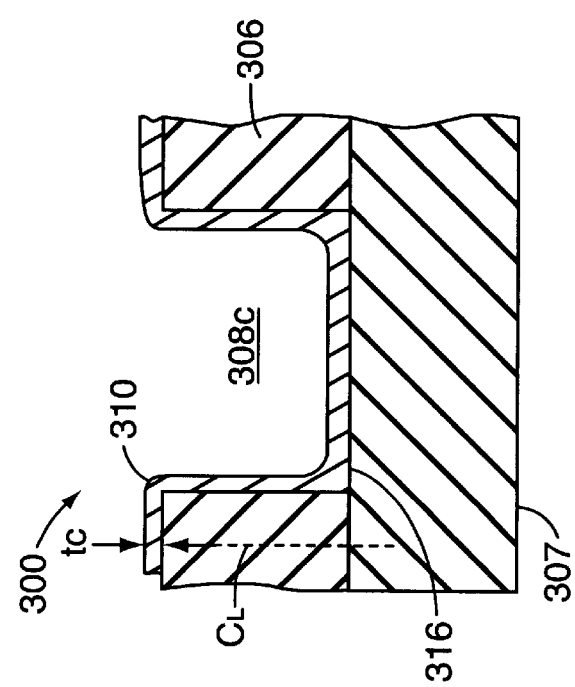
FIG. 3a
FIG. 3b
FIG. 3c

TUNGSTEN PLUGS FOR INTEGRATED CIRCUITS AND METHOD FOR MAKING SAME

This is a Continuation application of prior application Ser. No. 09/097,318 filed on Jun. 12, 1998, now U.S. Pat. No. 5,990,561, which designated the United States, the disclosure of which is incorporated herein by reference.

DESCRIPTION

1. Technical Field

This invention relates generally to the fabrication of integrated circuits, and more particularly to the formation of tungsten plugs used in integrated circuits.

2. Background Art

Over the past several decades, integrated circuits (ICs) have become an integral part of modern electrical devices. As such, processes associated with the development of ICs are constantly being refined to improve both the yield and the quality of ICs. In conventional IC fabrication techniques, after vias are formed in layers of oxide which are deposited over metal layers, tungsten (W) plugs may be formed in the vias to establish connections between a metal layer and an IC device or between different metal layers. Maintaining the planarity of a semiconductor wafer surface during the fabrication of plugs is crucial to provide a suitable surface for any subsequent photo-lithography and other processes.

FIG. 1a is a diagrammatic side-view representation of a conventional, partially processed semiconductor wafer 10. Wafer 10 is mounted on, for example, an electrostatic chuck 11, which may be provided with backside helium cooling as part of a process for controlling wafer temperature across most of wafer 10. In the process of fabricating wafer 10, a layer of oxide 12 is deposited over a semiconductor substrate 14, and via holes or "vias" 16, are formed in oxide layer 12. It should be appreciated that oxide layer 12 may generally refer to any inter-metal dielectric layer, such as an inter-metal oxide layer (IMO). By way of example, an overall IMO layer may include oxide layers and a spin-on glass layer. A "glue layer" 18, which is typically a titanium nitride (TiN) or titanium tungsten (TiW) layer, can be deposited over oxide layer 12 and within vias 16 to enable a tungsten layer 20 to better "stick," or adhere, to oxide layer 12. The prior art process of depositing glue layer 18 results in an essentially uniform glue layer where the thickness of the layer is essentially constant. This essentially constant glue layer thickness is usually such that uniformity in the thickness is maintained to within approximately five percent. That is, the difference between the average glue layer thickness at the edge 24 of wafer 10 and the glue layer thickness at the center (not shown) of wafer 10 is approximately five percent of the glue layer thickness at the center of wafer 10.

Tungsten layer 20 is eventually etched back to form tungsten plugs in vias 16. The tungsten etchback process is dependent upon factors which include, but are not limited to, wafer temperature and the composition of plasma used in the etchback process. This etchback is typically done in plasma which contains a fluorinated gas such as sulfur hexaflouride ($SF_6$). Once the bulk of the tungsten film 20 is removed, leaving only residual tungsten and tungsten-filled plugs, as will be described with respect to FIG. 1b, glue layer 18, e.g. a TiN layer, is exposed to the fluorinated plasma.

The etch rate of the residual tungsten has been observed to slow locally once TiN, that is, glue layer 18, is exposed to the fluorinated plasma. This slowing of the etch rate is generally believed to be a result of the redeposition of titanium fluorides produced from the reaction of the fluorinated plasma with TiN. The titanium fluorides deposit on residual tungsten and block the plasma, thereby locally reducing the etch rate of both tungsten and TiN. As the redeposition mechanism is dependent on temperature, the etch rate of TiN is also dependent upon temperature; higher temperatures prevent redeposition of titanium fluoride and, hence, the etch rates of tungsten and TiN. Thus, if some regions of wafer 10, as for example edge 24 of wafer 10, have higher temperatures than other areas, the etch rates of tungsten and TiN will also be higher in those regions. More importantly, if the glue layer etches through in the regions of elevated temperatures, due to the higher local etch rate, any underlying dielectric film, typically a silicon dioxide ($SiO_2$) layer, will be exposed to the plasma, $SiO_2$ etches readily in a fluorinated plasma; hence, oxygen is released into the plasma, thereby accelerating the etch rate of tungsten layer 20. The acceleration has been observed as being sufficient to locally etch out much or all of tungsten plugs formed during the etching process, as will be described with respect to FIG. 1b.

FIG. 1b is an enlarged and exaggerated side-view representation of a portion of semiconductor wafer 10 of FIG. 1a after a tungsten etchback process. After the tungsten layer 20 is etched, it is typically desirable for tungsten to remain only within vias 16 so that the surface of the processed wafer is essentially planar in preparation for subsequent processing steps. Within vias 16, remaining tungsten forms tungsten plugs, as for example tungsten plug 20a in via 16a. Tungsten plug 20a, which is located away from the edge of wafer 10 is representative of a tungsten plug which is formed as desired, as tungsten plug 20a is not recessed in via 16a. In other words, tungsten plug 20a is situated within via 16a such that a surface 28a of tungsten plug 20a is approximately level with the "top" of glue layer 18 and, hence, the "top" 19 of oxide layer 12.

The effect of chuck 11 is such that the portions of wafer 10 near the edge 22 of chuck 11 are hotter than other portions of wafer 10. With reference to FIG. 1a, this is due, in part, to the fact that the edge of the wafer 10 overlaps the edge of the chuck 11 and, therefore, is not cooled by the chuck 11. As described above, the etch rate of glue layer 18, i.e. TiN layer, increases with temperature. Hence, the portions of glue layer 18 overlapping the edge 22 of electrostatic chuck 11 will etch more quickly than other portions of glue layer 18. Thus, portions of glue layer 18 near the edge 22 may etch through, thereby exposing oxide layer 12. As shown, oxide layer 12 is exposed at the edge 24 of wafer 10.

The enhanced production of fluorine which results from etching through $SiO_2$ (oxide) layer 12 locally increases the etch rate of tungsten layer 20. That is, the etch rate of tungsten near the location where oxide is exposed is higher than the etch rate of tungsten in locations away from where oxide is exposed. As such, more tungsten is etched near the edge 24 of wafer 10 where oxide layer 12 is exposed than at portions of wafer 10 away from the edge 24 where oxide layer 12 is exposed. The result of the etching of a larger amount of tungsten near the edge 24 of wafer 10 is the over-etching of tungsten plugs near the edge 24 of wafer 10, as for example tungsten plug 20d. As shown, tungsten plugs which are further from the edge 24 of wafer 10, as for example tungsten plug 20c, are less over-etched or "recessed" than those closer to edge 24, as for example tungsten plug 20d. Similarly, tungsten plug 20b, which is still further from edge 24, is less recessed than tungsten plug 20c. Therefore, to completely etch plugs that are not near the edge 24 of wafer 10 (such as plug 20a), there is a tendency to over-etch the plugs near the edge 24 (such as plugs 20b, 20c, 20d), resulting in recessed plugs near the edge 24 of wafer 10.

While the exposure of oxide generally tends to increase the etch rate of tungsten, as mentioned above, the temperature of the semiconductor wafer also has an affect on the etch rate of tungsten. Further, the etch rate of the glue layer, which is typically a TiN layer, is also affected by the temperature of the wafer. A standard measure of the relationship between the etch rate of tungsten and the etch rate of TiN is etch rate selectivity. Etch rate selectivity may be described as the ratio of the tungsten etch rate to the glue layer etch rate.

FIG. 1c is a graphical representation of the relationships between tungsten etch rates, TiN etch rates, tungsten and TiN etch rate selectivity, and temperature. As previously mentioned, the glue layer as is typically a TiN layer. Graph 50 shows the dependency of etch rates and etch rate selectivity upon temperature. Plot 54 represents the relationship between the etch rate of tungsten, in units of Angstroms per second, and electrode temperature, in degrees Centigrade. Plot 54 shows that as temperature increases, the etch rate of tungsten increases slightly. Similarly, Plot 56, which represents the relationship between the etch rate of TiN and temperature shows the etch rate of TiN also increases as temperature increases. However, the etch rate of TiN is relatively lower than the etch rate of tungsten for the temperatures shown in graph 50.

Although both the etch rate of tungsten and the etch rate of TiN increase as a function of temperature, the etch rate of TiN increases more rapidly than the etch rate of tungsten. Hence, the etch rate selectivity, which is the ratio between the etch rate of tungsten and the etch rate of TiN, decreases as temperature increases, as shown by plot 58.

As described earlier, tungsten plugs which are recessed typically compromise the planarity of the semiconductor wafer on which the tungsten plugs are situated. As the planarity of the surface of a wafer is important for subsequent processing steps, these recessed tungsten plugs may reduce the yield of integrated circuits located on the wafer or require extra planarization steps. What is needed is a method of producing tungsten plugs which minimizes the plug recess that may result from a tungsten etchback process.

DISCLOSURE OF THE INVENTION

A method for producing a glue layer for an integrated circuit which uses tungsten plugs in accordance with the present invention includes: (A) providing a substrate which has a surface, a center, an edge, and a direction normal to the surface; and (B) sputter depositing a glue layer over the surface of the substrate such that an edge thickness of the glue layer measured in the direction normal to the surface at the edge of the substrate is at least 105% of a center thickness of the glue layer measured in the direction normal to the surface at the center of the substrate. In some embodiments, the edge thickness of the glue layer measured in the direction normal to the surface at the edge of the substrate is in the range of approximately 105% to 150% of the center thickness of the glue layer measured in the direction normal to the surface at the center of the substrate, as for example in the range of approximately 110% to 120%.

A method for producing a tungsten plug for an integrated circuit in accordance with the present invention includes: (A) forming an oxide layer over a supporting substrate, the oxide layer defining a surface, a center, an edge, and a direction normal to the surface; (B) forming at least one via hole in the oxide layer; (C) sputter depositing a glue layer over the surface of the oxide layer such that an edge thickness of the glue layer measured in the direction normal to the surface at the edge of the oxide layer is at least 105% of a center thickness of the glue layer measured in the direction normal to the surface at the center of the oxide layer; (D) forming a tungsten layer over the glue layer; and (E) etching the tungsten layer to form a tungsten plug within the via, whereby the glue layer is not etched through proximate the edge during the etching step due to its greater thickness proximate the edge.

The present invention provides an improved method for forming tungsten plugs in vias on a semiconductor wafer substrate. The use of a conformal, non-uniform glue layer which is thicker near the edges of the substrate promotes uniformity in the heights of tungsten plugs despite temperature effects which are present at and near the edges, by preventing etchback processes from etching through the glue layer at the edges. By preventing the etch-through of the glue layer, oxygen is not released from the oxide layer, and, therefore, the etch rate of tungsten is not accelerated. Hence, the tungsten plugs formed in vias near the edges of the substrate be of essentially the same height as tungsten plugs formed elsewhere on the wafer.

These and other advantages of the present invention will become apparent upon reading the following detailed descriptions and studying the various figures of the drawings.

BRIEF DESCRIPTION OF THE DRAWINGS

FIG. 3a is a highly exaggerated cross-sectional view of a portion of a semiconductor wafer with a conformal glue layer which extends from a centerline of the wafer to an edge of the wafer.

FIG. 3b is an enlarged, cross-sectional view of a portion of the wafer of FIG. 3a which is adjacent to the centerline of the wafer.

FIG. 3c is an enlarged, cross-sectional view of a portion of the wafer of FIG. 3a which is adjacent to the edge of the wafer.

BEST MODES FOR CARRYING OUT THE INVENTION

Figure 1A:
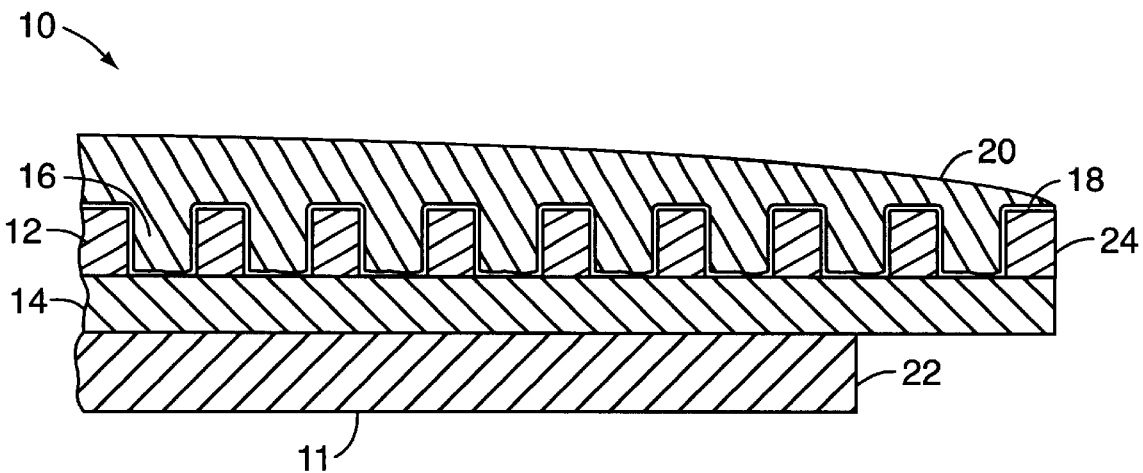
FIG. 1a is an exaggerated, cross-sectional view of a partially processed prior art semiconductor wafer during the formation of tungsten plugs.
Figure 1B:
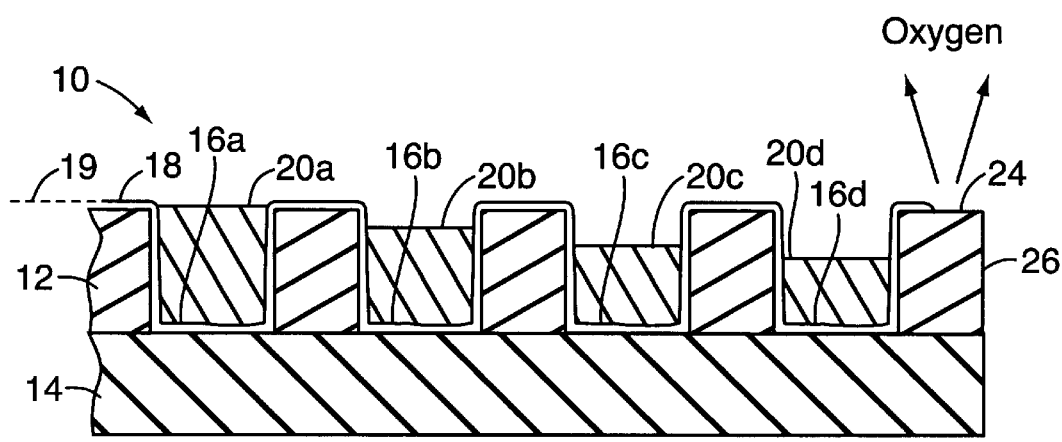
FIG. 1b is an exaggerated, cross-sectional view of a portion of the prior art semiconductor wafer of FIG. 1a a after the tungsten layer has been etched.
Figure 1C:
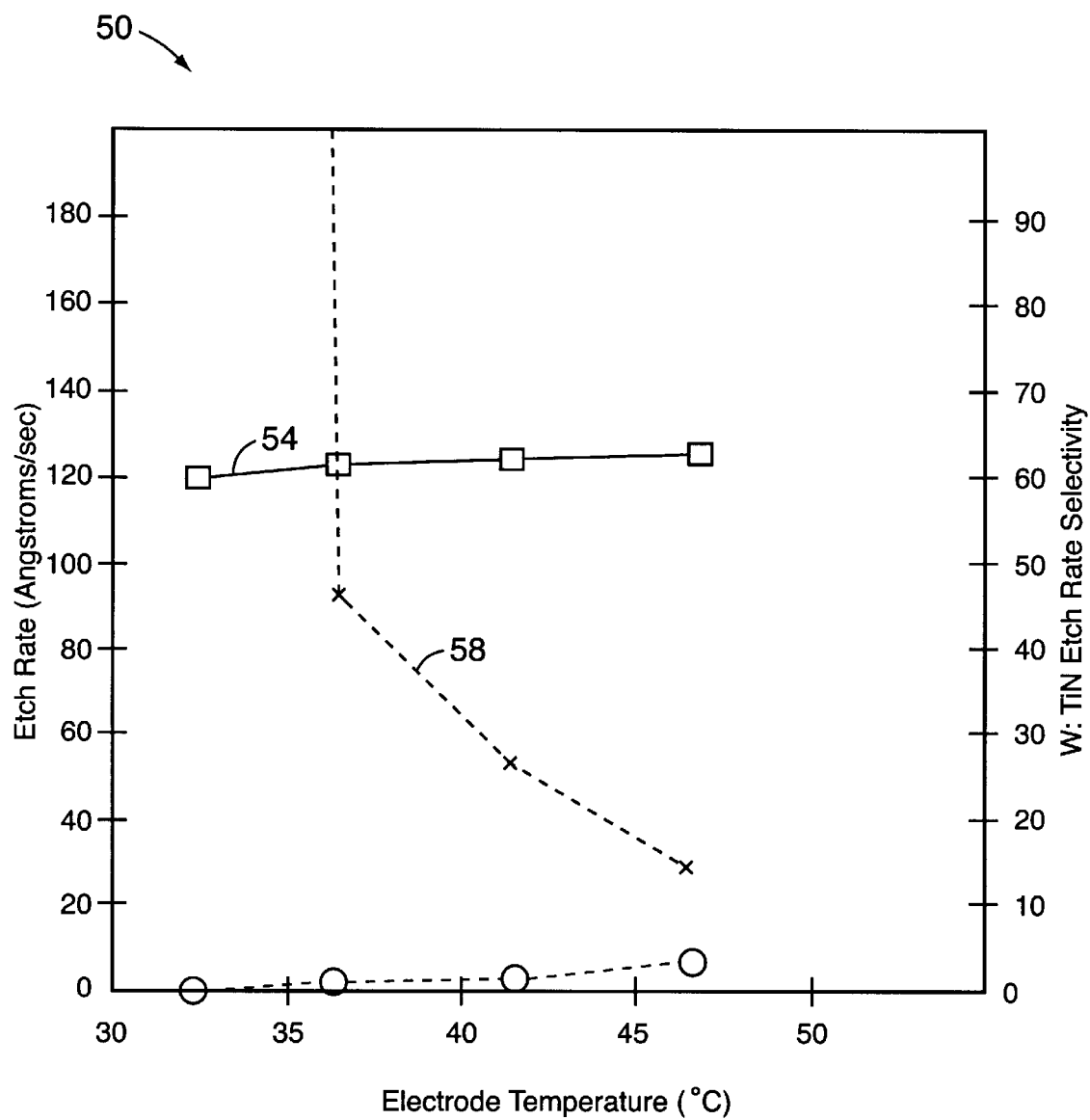
FIG. 1c is a graph illustrating the relationships between tungsten etch rates, TiN etch rates, tungsten and TiN etch rate selectivity, and electrode temperature.

FIGS. 1a and 1b are exaggerated, cross-sectional views of partially processed prior art semiconductor wafers and were discussed previously. FIG. 1c is a graph illustrating the relationships between etch rates and temperature, and was also discussed previously.

Figure 2:
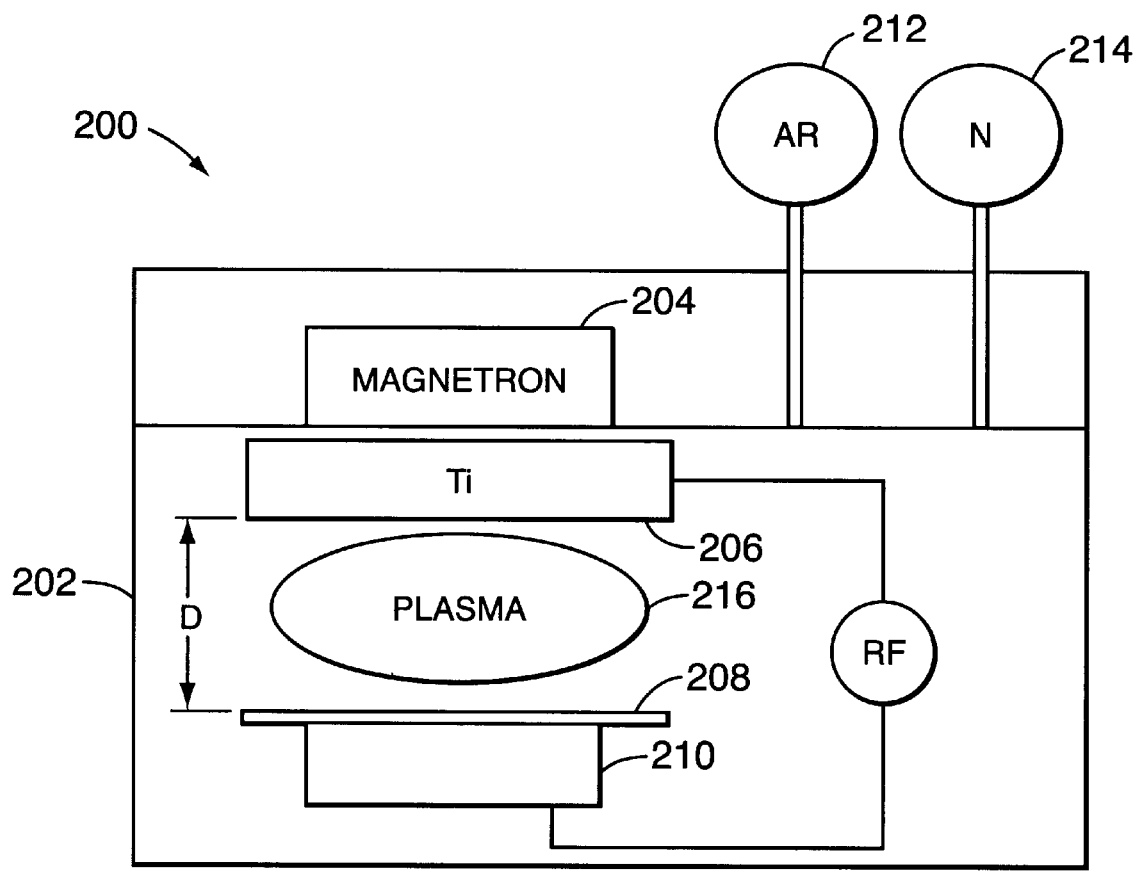
FIG. 2 is a diagrammatic representation of a deposition chamber which may be used in the process of depositing titanium (Ti) on the surface of an IC.

FIG. 2 is a diagrammatic representation of a deposition chamber which may be used to produce tungsten plugs in integrated circuits in accordance with the present invention. Deposition chamber 200 is a part of a piece of equipment known as a "physical vapor deposition" or "sputter" machine, which is used to sputter deposit materials (such as a "glue layer") over a semiconductor wafer, and includes a chamber cavity 202, which houses a target 206, and a magnetron 204. In some embodiments, magnetron 204 is mounted in chamber 200 such that it may rotate. The preferred rotational velocity of magnetron 204 is in the range of approximately 70 to 120 revolutions per minute, as for example 90 revolutions per minute. In other embodiments, magnetron 204 is mounted in chamber cavity 202 such that magnetron 204 does not rotate.

Target 206, which may be of any number of shapes, is situated below magnetron 204 and is comprised of a material which is to be used, for example, to create a glue layer on a wafer 208 which is mounted on a chuck 210. Target 206 may be, but is not limited to being, comprised of titanium when a glue layer is to be deposited. Gas sources, as for example an argon gas source 212 and a nitrogen gas source 214, are used to supply chamber cavity 202 with components which are used in part to affect plasma 216 in chamber cavity 202. Nitrogen gas source 212 is typically used if a glue layer on wafer 208 is to be comprised of titanium nitride (TiN). On the other hand, if a glue layer on wafer 210 is to be comprised of other materials, as for example titanium tungsten (TiW), argon gas source 212 may be used. Plasma 216 is typically located in the vicinity of target 206 and is generated by a RF field between the chuck 210 and the target 206. Ions from the plasma 216 are accelerated to the target 206 such that particles of the target are "showered," e.g. reactive ion sputtered, onto wafer 208 to form, for example, a glue layer on wafer 208.

With continuing reference to FIG. 2, it has been discovered that the spacing between target 206 and wafer 208 may be varied in order to control the deposition profile of the glue layer formed on wafer 208. That is, the distance "D" between target 206 and wafer 208 may be changed during the sputter deposition process to thicken the glue layer near the edges of wafer 208 relative to more central portions of the wafer. By thickening the glue layer near the edges of wafer 208, given that the etch rate of the glue layer is typically lower than that of tungsten for a given temperature, during a subsequent tungsten etchback process, the likelihood of the exposure of oxygen from the IMO layer is reduced, as a thicker glue layer with a lower etch rate must first be etched through. Therefore, the possibility of recessed tungsten plugs being formed in vias near the edge of wafer 208 is reduced.

A conformal glue layer of the present invention which is progressively thicker towards the edges of a wafer will be described below with reference to FIGS. 3a, 3b, and 3c, while a process for forming tungsten plugs in accordance with the present invention will be described below with respect to FIGS. 4 and 5.

In general, the desired non-uniformity of the glue layer is such that the thickness of the glue layer near the edges of wafer 208 is at least 105% of the thickness of the glue layer near the center of wafer 208, as for example in the range of 110% to 120% of the glue layer thickness near the center of the wafer, as will be described in more detail below with reference to FIGS. 3a, 3b, and 3c. To achieve the desired non-uniformity, the spacing between target 206 and wafer 208 is varied in the range of approximately 2 to 10 centimeters. More preferably, spacing may be varied in the range of approximately 4 to 8 centimeters. It should be appreciated that the spacing may be widely varied, and is dependent upon factors which include, but are not limited to, the desired non-uniformity of the glue layer and the specific erosion profile of target 206.

It should also be noted that intentionally making a layer to be non-uniform is contrary to the accepted wisdom. Therefore, with most sputter processes, the layers are intentionally made as uniform as possible by separating chuck 210 and target 206 by at least approximately 3 centimeters. In a preferred embodiment, the separation of chuck 210 and target 206 is at least approximately 4.5 centimeters. This will result in a non-uniformity of less than five percent, which is typically considered to be acceptable.

The shape of target 206 and, therefore, the target erosion profile, can also be altered in order to control the deposition profile of the glue layer formed on wafer 208. Similarly, magnetron 204 and, hence, the sputtering pattern, can also be changed to vary the deposition profile of the glue layer. In some embodiments, magnetron 204 is rotated, or rotated at different velocities, in order to cause a variation in the deposition profile of the glue layer. In order to achieve the desired deposition profile, the rotational velocity of magnetron 204 is preferably varied within the range of approximately 70 to 120 revolutions per minute, as for example in the range of 80 to 100 revolutions per minute, while the spacing between target 205 and wafer 208 is varied within the previously described range.

Figure 3D:
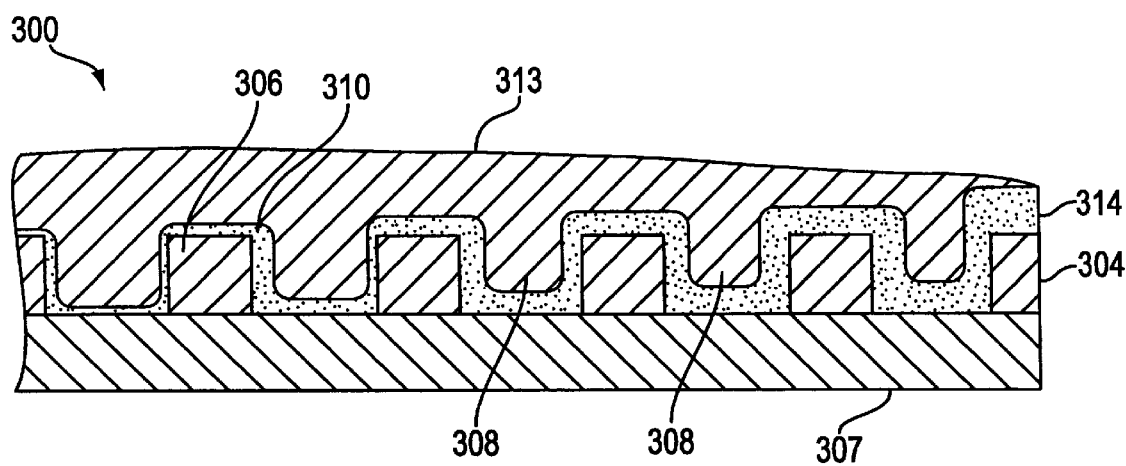
FIG. 3d is a highly exaggerated cross-sectional view of a portion of a semiconductor wafer with the conformal glue layer and a tungsten layer thereon.

FIG. 3a is a highly exaggerated cross-sectional view of a portion of a semiconductor wafer with a conformal glue layer which extends from a centerline of the wafer to an edge of the wafer. It should be appreciated that the relative dimensions of a portion of semiconductor wafer 300 as shown are greatly exaggerated for ease of illustration. The portion of wafer 300 as shown extends from a centerline 302 of wafer 300 to a side edge 304 of wafer 300. Wafer 300 includes an IMO layer 306 formed over a semiconductor substrate 307 and vias 308 formed in IMO layer 306. A conformal, non-uniform glue layer 310 is situated over IMO layer 306 and within vias 308, as for example vias 308c and 308e. The top surface profile 311 of glue layer 310 is such that glue layer 310 is thicker at side edge 304 than near centerline $c_L$. Between centerline 302 and side edge 304, the thickness of glue layer 310 increases. The specific profile of glue layer 310 is dependent upon the tungsten etchback process which is subsequently used to etch a tungsten layer 313 deposited over glue layer 310 to form tungsten plugs, as will be described below with respect to FIGS. 3d, 4 and 5. In general, the profile of glue layer 310 increases from a centerline thickness $t_c$ at centerline $c_L$ to a side edge thickness $t_e$ at side edge. Preferably, $t_e$ is at least 105% of the thickness of $t_c$. It should be appreciated that the relative scale of side edge thickness $t_e$ as shown, as compared with centerline thickness $t_c$, has been exaggerated for illustrative purposes.

FIG. 3b is a diagrammatic side-view representation of a portion of wafer 300, as described above with respect to FIG. 3a, which is directly adjacent to centerline $c_L$. Centerline thickness $t_c$ is generally measured in a direction normal to the surface of IMO layer 306 in the vicinity of centerline $c_L$. In some embodiments, where centerline $c_L$ traverses a via, e.g. via 308c, such that centerline $c_L$ does not pass through IMO layer 306, centerline thickness $t_c$ may be measured in a direction normal to the surface at the bottom 316 of via 308c at centerline $c_L$. The surface at the bottom 316 of via 308c at centerline $c_L$ is typically the surface of a metallization layer. Centerline thickness $t_c$ is dependent upon many factors, including the requirements of the sputter deposition process used to subsequently deposit a tungsten layer 313 over glue layer 310. Typically, the centerline thickness $t_c$ is in the range of approximately 400 to 600 Angstroms. More preferably, centerline thickness $t_c$ is approximately 500 Angstroms.

FIG. 3c is an enlarged cross-sectional view of a portion of wafer 300, as described above with respect to FIG. 3a, which is proximate to side edge 304. Side edge thickness $t_e$ is typically measured in a direction normal to the surface of IMO layer 306 proximate to side edge 304. Preferably, side edge thickness, or "height," $t_e$ is in the range of approximately 110% to 120% of centerline thickness, or "height," $t_c$, as previously described with respect to FIG. 3b.

Figure 4:
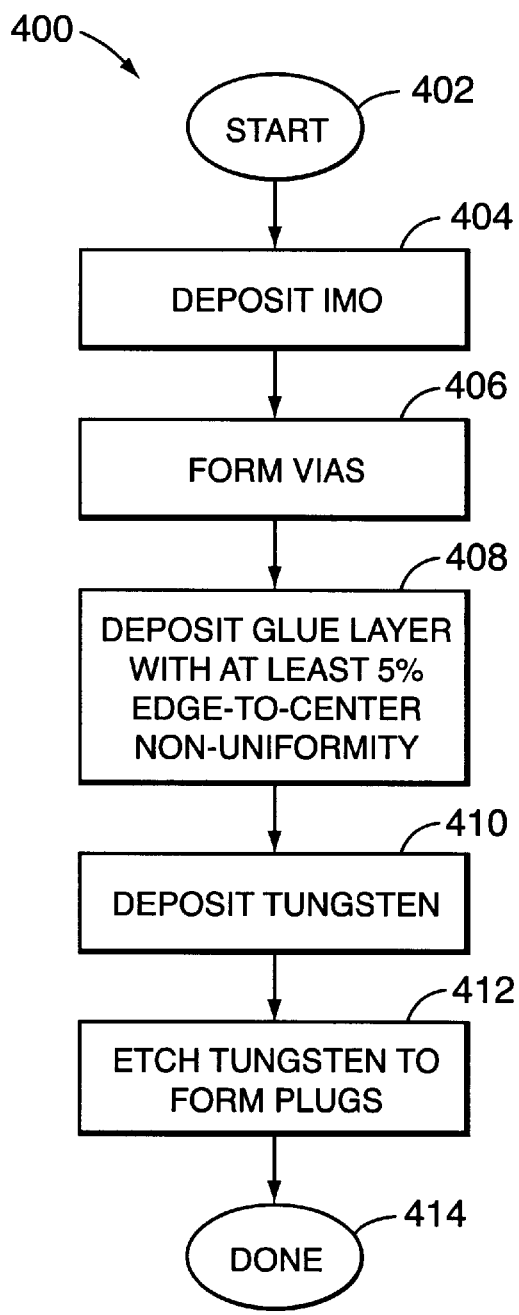
FIG. 4 is a process flow diagram illustrating a process for forming tungsten plugs.

FIG. 4 illustrates a process of forming tungsten plugs in via holes on a semiconductor wafer. The process 400 of forming tungsten plugs begins at 402. In a step 404, an IMO is deposited on the wafer by processes which are well known to those skilled in the art. Typically, the IMO is deposited over a metallization layer patterned over the substrate. In a step 406, vias are formed through the IMO using suitable methods well known to those skilled in the art. After the vias, or contacts, are formed, a glue layer is deposited over the IMO in a step 408 in order to enable subsequently deposited tungsten to adhere to the IMO. As described above, in some embodiments, the glue layer may be either a TiN layer or a TiW layer. The glue layer is deposited such that there is at least a five percent edge-to-center non-uniformity. That is, the glue layer is deposited so that the thickness of the glue layer at the edge of the wafer is at least five percent greater than the thickness of the glue layer at the center of the wafer. Specific steps involved with the process of depositing the glue layer over the IMO will be described below with respect to FIG. 5.

After the glue layer is deposited in step 408, the tungsten layer 313 is deposited as a blanket over the wafer in a step 410. See FIG. 3d. Step 410 can be, for example, a tungsten sputter or a tungsten chemical vapor deposition (CVD) step. Then, in a step 412, the tungsten layer 313 is etched using any suitable method, as for example a plasma etching process, to form plugs in the vias which were created in step 406.

Since the glue layer is thicker at the edges of the wafer than at the center of the wafer, when the tungsten layer 313 is etched back such that the glue layer is exposed and the tungsten only remains in the vias, the result is that the tungsten plugs formed in the vias are of essentially the same height. That is, the tungsten plugs that are formed are relatively level with the exposed surface of the glue layer due to the increased thickness of the glue layer at the edges of the wafer. As such, the increased tungsten etch rates at and near the edges of the wafer will not result in oxygen being released from the etched IMO layer.

In the described embodiment, the width of a tungsten plug, measured in a direction normal to the surface of the wafer, may be in the range of approximately 2000 to 10,000 Angstroms, as for example in the range of approximately 4000 to 6000 Angstroms. One suitable width for a tungsten plug is approximately 5000 Angstroms. The height of the tungsten plug may be approximated as the height of the IMO layer, which may be in the range of approximately 3,000 to 15,000 Angstroms, as for example in the range of approximately 8,000 to 10,000 Angstroms. The glue layer of the described embodiment has a thickness in the range of approximately 100 to 1000 Angstroms, as for example approximately 500 Angstroms.

As described above, the increased temperature near the edges of the wafer, relative to the temperature at other portions of the wafer, causes an increase in the etch rate of the glue layer at the edges of the wafer. However, with the increased thickness of the glue layer at the edges of the wafer, the glue layer does not etch through before the end of the tungsten etchback process. As such, the IMO layer will not be exposed at the edges of the wafer prior to the removal of the blanket tungsten to form tungsten plugs. Hence, as the IMO layer will not be exposed during the step of etching tungsten, the etch rate of tungsten will not be accelerated by the oxygen released from the IMO layer. After the tungsten is etched, the process of forming tungsten plugs is completed at 414.

Figure 5:
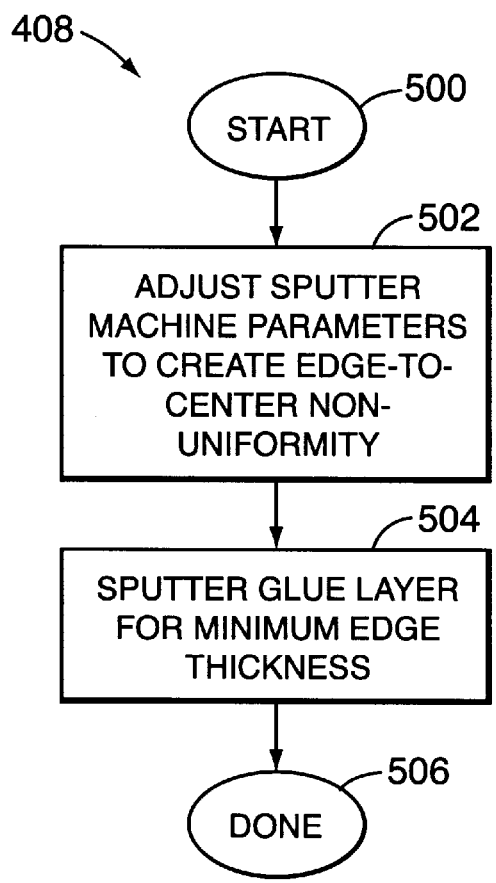
FIG. 5 is a process flow diagram illustrating the "DEPOSIT GLUE LAYER WITH AT LEAST 5% EDGE TO CENTER NON-UNIFORMITY" step of FIG. 4.

FIG. 5 illustrates the process of depositing a glue layer in more detail. The process 408 begins at 500. In a step 502, parameters pertaining to the sputter machine, which is to be used to deposit a glue layer on a wafer, are adjusted such that a glue layer with an edge-to-center non-uniformity may be deposited. Parameters which may be adjusted to enable a glue layer with an edge-to-center non-uniformity to be deposited include the separation between the target and the wafer, the shape of the target, and the sputtering pattern, i.e. the pattern created by the magnetron. After sputter machine parameters are adjusted, a non-uniform glue layer with a minimum edge thickness is sputtered onto the wafer, or, more specifically, an IMO layer on the wafer, in a step 506. The edge thickness of the glue layer is the thickness measured in a direction normal to the surface of the edge of the IMO layer beneath the glue layer. The edge thickness of the glue layer may be just thick enough so that the edge is not etched through by the tungsten etchback process which occurs after tungsten is deposited over the glue layer, as previously described with respect to FIG. 4. Hence, the edge thickness of the glue layer is dependent upon the actual tungsten etchback process used, i.e. the edge thickness is a heuristic property. As mentioned above, it should be appreciated that the area which is considered to be the "edge" of the wafer may vary depending upon the actual size of the wafer. However, in the described embodiments, the edge of the wafer is generally considered to be the area encompassed by approximately the outer 5 to 10 millimeters of the wafer. After the glue layer is sputter deposited over the IMO layer, the process of depositing a glue layer is completed at 506.

In the described embodiments, the desired edge-to-center non-uniformity of the glue layer is such that the edge thickness of the glue layer is at least 105% of the center thickness of the glue layer, where the center thickness of the glue layer is measured in a direction normal to the surface of the center of the IMO layer. More preferably, the edge thickness of the glue layer is in the range of approximately 105% to 150% of the center thickness of the glue layer, as for example in the range of approximately 110% to 120% of the center thickness of the glue layer.

As previously mentioned, the edge thickness of the glue layer is a heuristic property which varies depending upon the tungsten etchback process to be subsequently utilized. The edge thickness of the glue layer may be such that after the tungsten etchback process, the "etched" edge thickness of the glue layer is in the range of approximately 400 to 600 Angstroms, which is approximately the desired thickness of the glue layer at the center of the wafer. More preferably, the edge thickness of the glue layer is specified such that the "etched," or final, edge thickness of the glue layer is approximately 500 Angstroms.

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims be interpreted as including all such alterations, permutations, and equivalents as fall within the true spirit and scope of the present invention.

What is claimed is:

1. An integrated circuit device being manufactured by a process comprising:

providing a substrate having a surface, a center portion, an edge portion, and a direction normal to said surface; and sputter depositing a glue layer over said surface of said substrate such that an edge thickness of said glue layer measured in said direction normal to said surface at said edge portion of said substrate is at least 105% of a center thickness of said glue layer measured in said direction normal to said surface at said center portion of said substrate.

2. An integrated circuit device as set forth in claim 1 wherein said edge thickness of said glue layer measured in said direction normal to said surface at said edge portion of said substrate is in the range of approximately 105% to 150% of said center thickness of said glue layer measured in said direction normal to said surface at said center portion of said substrate.

3. An integrated circuit device as set forth in claim 2 wherein said edge thickness of said glue layer measured in said direction normal to said surface at said edge portion of said substrate is in the range of approximately 110% to 120% of said center thickness of said glue layer measured in said direction normal to said surface at said center portion of said substrate.

4. An integrated circuit device as set forth in claim 1 wherein said glue layer is a titanium nitride layer.

5. An integrated circuit device as recited in claim 1 wherein said glue layer is a titanium tungsten layer.

* * * * *